United States Patent
Di Cioccio et al.

(10) Patent No.: US 8,642,391 B2
(45) Date of Patent: Feb. 4, 2014

(54) SELF-ASSEMBLY OF CHIPS ON A SUBSTRATE

(75) Inventors: Lea Di Cioccio, Saint Ismier (FR); Francois Grossi, Grenoble (FR); Pierric Gueguen, Echirolles (FR); Laurent Vandroux, Le Cheylas (FR)

(73) Assignee: Commissariat a l'energie atomique et aux energies alternatives, Paris (FR)

( * ) Notice: Subject to any disclaimer, the term of this patent is extended or adjusted under 35 U.S.C. 154(b) by 4 days.

(21) Appl. No.: 12/936,765

(22) PCT Filed: Apr. 7, 2009

(86) PCT No.: PCT/EP2009/054115
§ 371 (c)(1),
(2), (4) Date: Oct. 8, 2010

(87) PCT Pub. No.: WO2009/124921
PCT Pub. Date: Oct. 15, 2009

(65) Prior Publication Data
US 2011/0033976 A1    Feb. 10, 2011

(30) Foreign Application Priority Data
Apr. 9, 2008    (FR) ...................................... 08 52370

(51) Int. Cl.
*H01L 21/00* (2006.01)
(52) U.S. Cl.
USPC ........... 438/118; 438/584; 438/628; 257/783; 257/E23.127; 257/E21.514

(58) Field of Classification Search
USPC ......... 438/106, 107, 108, 109, 110, 118, 584, 438/597, 618, 622, 625, 628; 257/678, 687, 257/707, 753, 779, 782, 783, E23.127, 257/E21.514
See application file for complete search history.

(56) References Cited

U.S. PATENT DOCUMENTS

| | | | |
|---|---|---|---|
| 6,507,989 B1 | 1/2003 | Bowden et al. | |
| 6,623,579 B1 | 9/2003 | Smith et al. | |
| 6,946,322 B2 | 9/2005 | Brewer | |
| 7,794,799 B1 * | 9/2010 | Kim et al. | 427/532 |
| 7,898,074 B2 * | 3/2011 | Eckhardt et al. | 257/690 |
| 2002/0155294 A1 * | 10/2002 | Veerasamy | 428/408 |
| 2004/0058423 A1 * | 3/2004 | Albritton et al. | 435/173.7 |
| 2005/0014151 A1 * | 1/2005 | Textor et al. | 435/6 |

(Continued)

FOREIGN PATENT DOCUMENTS

| | | | |
|---|---|---|---|
| JP | 2004-382089 | * | 12/2004 |
| WO | WO2006/077739 | * | 7/2006 |

OTHER PUBLICATIONS

Preliminary Report issued Dec. 19, 2008, in French Patent Application No. FR 0852370 (with English translation of Category of Cited Documents).

(Continued)

*Primary Examiner* — William D Coleman
*Assistant Examiner* — Su Kim
(74) *Attorney, Agent, or Firm* — Oblon, Spivak, McClelland, Maier & Neustadt, L.L.P.

(57) ABSTRACT

A method of forming, on a surface of a substrate, at least one hydrophilic attachment area for the purpose of self-assembling a component or a chip, in which a hydrophobic area, which delimits the hydrophilic attachment area, is produced.

23 Claims, 11 Drawing Sheets

(56) References Cited

U.S. PATENT DOCUMENTS

| | | | |
|---|---|---|---|
| 2005/0252398 A1* | 11/2005 | Ohkura et al. | 101/368 |
| 2006/0226203 A1* | 10/2006 | Lu et al. | 228/219 |
| 2009/0023243 A1* | 1/2009 | Koyanagi | 438/107 |
| 2011/0233791 A1* | 9/2011 | Mastrangeli et al. | 257/777 |

OTHER PUBLICATIONS

International Search Report Issued Apr. 7, 2009, in PCT /EP2009/054115 (with English translation of Category of Cited Documents).

Takafumi Fukushima, et al., "New Three-Dimensional Integration Technology Using Self-Assembly Technique", Electron Devices Meeting, IEEE, XP010903478, Dec. 5, 2005, pp. 348-351.

Q. Y. Tong, et al., "Semiconductor Wafer Bonding", Science and Technology, John Wiley and Sons, chapter 4, 1999, pp. 57-67.

Minglin Ma, et al., "Superhydrophobic Surfaces", Current Opinion in Colloid and Interface Science, 11, 2006, pp. 193-202.

Kaiji Sato, et al., "Self-alignment for Microparts Assembly Using Water Surface Tension", Device and Process Technologies for MEMS and Microelectronics, Oct. 1999, vol. 3892, pp. 321-329.

Sean A. Stauth, et al., "Self-assembled Single-crystal Silicon Circuits on Plastic", PNAS, Sep. 19, 2006, vol. 103, No. 38, pp. 13922-13927.

* cited by examiner

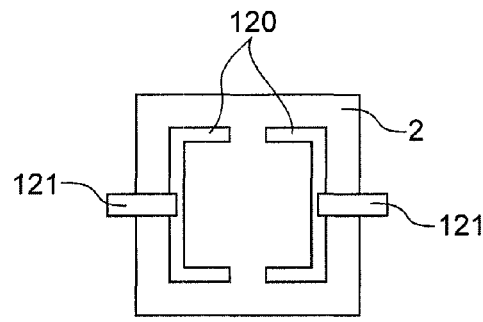
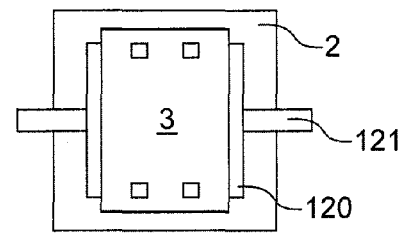
FIG.10A  FIG.10B
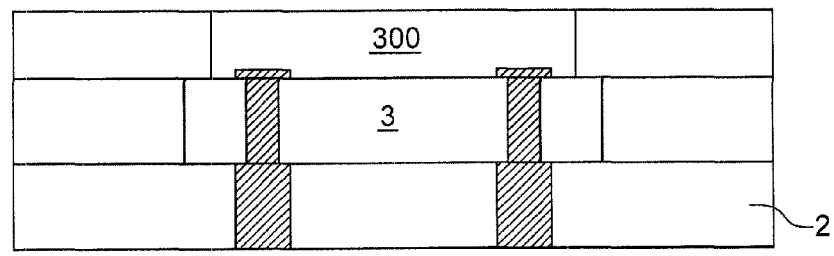
FIG.11A
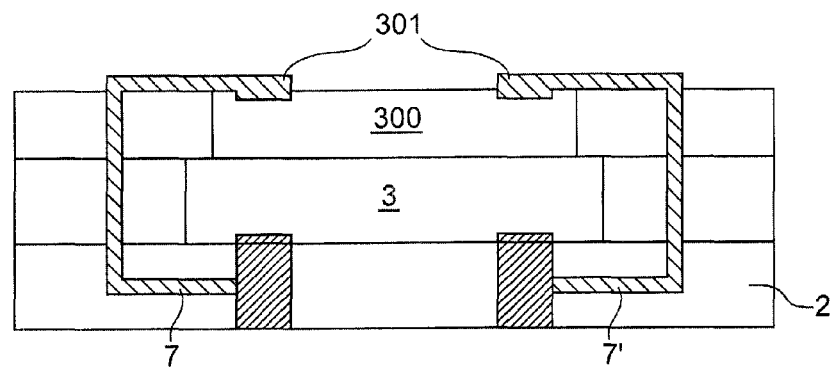
FIG.11B

SELF-ASSEMBLY OF CHIPS ON A SUBSTRATE

TECHNICAL FIELD AND PRIOR ART

The invention relates to the assembly of chips or components or MEMS or integrated circuits on a substrate, in particular in the field of microelectronics.

This invention applies to the 3D integration of these components or chips or MEMS or integrated circuits, as well as to the design of integrated micro-systems.

The positioning of a chip (throughout the description and the claims, this term or the term "component" is used hereafter for all of the above mentioned devices, including MEMS or integrated circuits) on a substrate is usually carried out by "pick and place" type robotic means. Due to the reduction in dimensions in 3D integration, and production speed requirements, this technique is becoming less and less adapted. Furthermore, its implementation involves the use of costly and complex machinery. Finally, this technique is a serial technique, thus costly in terms of time.

Self-assembly techniques are being increasingly envisaged as alternatives or a complement to robotics. Such a technique is for example that described by T. Fukushima et al. in the article entitled "New three dimensional integration technology using self assembly technique", IEEE, 2005.

The advantage of this type of technique is that it makes it possible to treat in parallel a large number of chips and that it is thus less costly, in particular than those of "pick and place" type.

But current self-assembly methods for the most part implement fluidic means, in aqueous environment, with alignment by shape recognition and bonding by addition of material (organic adhesive). The localisation of the area on which the chip will be hybridised is achieved by local adsorption of SAM type molecules (alkane thiol), in other words that a molecule fixes itself preferentially onto a part of the substrate by creating an area with a different surface state.

The problem of such methods is that the attachment substrate must be composed on the surface of specific tie materials such as gold or that it has to be hollowed out to favour the assembly, as in document U.S. Pat. No. 6,623,579. Furthermore, certain materials, which serve as link between the chip and the substrate, are organic and are thus a source of pollution. In all cases, the possible applications are limited on account of the limitation in temperature. For example, producing a functional contact (optical, electrical, thermal) is more complex if the chip and the substrate are linked by organic molecules.

A problem is thus finding a method not having the above limitations and enabling in particular a rapid and precise assembly to be carried out.

DESCRIPTION OF THE INVENTION

The invention proposes a novel method of forming, on the surface of a substrate, an area for the purpose of the alignment or the self-assembly of a component or a chip, as well as a technique for assembling this component or this chip.

Firstly, according to the invention, a method of forming, on the surface of a substrate, at least one hydrophilic attachment area for the purpose of self-assembling a component or a chip, comprises the formation of a hydrophobic area, which delimits or defines said hydrophilic attachment area.

The obtaining of two areas, one hydrophobic and the other hydrophilic (attachment area), results from the use, on the surface of the substrate, of at least two materials having different wettability properties, which results, either from the very nature of said materials or from a specific treatment of said materials. From the different wettability results, for one area, a hydrophilic character, which enables it to constitute an attachment area, and for the other a hydrophobic character, which enables it to delimit the attachment area.

A plurality of hydrophilic attachment areas may be formed.

The treatment of a surface according to the invention may be local. An attachment area may thus be easily localised.

Such an attachment area and its hydrophobic area that delimits it may be formed on any substrate, for example made of plastic.

A method according to the invention may comprise a step of depositing, at least in the hydrophilic attachment area, a layer for bonding, or assisting the bonding, of a component or a chip.

The surface of the attachment area may be transformed to be rendered hydrophilic, for example by the formation of an oxide or nitride layer (combined with a treatment rendering it hydrophilic).

The surface of the substrate may be initially homogeneous, or heterogeneous.

In the latter case, it may comprise at least one pad and/or a via and/or a contact flush with the surface of the substrate and ensuring an electrical and/or optical and/or thermal connection. At least one of the pads and/or vias and/or contacts is localised in the attachment area. The substrate may further comprise electrical and/or optical and/or thermal connection layers.

Once a substrate according to the invention has been formed, it is possible to align, on the hydrophilic area, then to bond on this same area, for example by direct bonding or molecular adhesion or thermocompression, a chip or a component on the self-assembly area, having the desired localised wettability contrast.

A method of assembling a component or a chip according to the invention may thus comprise the following steps:

a) preparation of a substrate according to the invention, as explained above, b) self-alignment of the chip on the prepared attachment area, using the differences in wettability between the hydrophobic areas of the substrate and the other, hydrophilic areas, c) assembly, by molecular bonding or thermocompression, of the chip aligned on the prepared site.

A method of assembling a component or a chip according to the invention does not require and does not implement a shape recognition technique to position a component near to its attachment area.

A method of assembling a component or a chip according to the invention may be carried out in air.

The step of alignment may be carried out by means of a drop of a liquid, for example water, deposited on the hydrophilic area.

The component or the chip may comprise one or more pads and/or vias and/or contacts and/or one or more layers made of low temperature melting material.

In the latter case, the method may further comprise a step of increasing the temperature to carry out a melting of said low temperature melting material.

A contact or a connection made of low temperature melting material may be formed between the component or the chip and the surface of the substrate, for example by the above mentioned technique.

A method according to the invention may further comprise, before alignment of the component or the chip, a step of preparation of the surface to be assembled of this component or this chip, such as a polishing and/or a treatment by oxygen plasma and/or a UV-ozone treatment.

According to a particular embodiment of the invention, a hydrophobic area is formed of amorphous carbon, for example in the form of thin film. The amorphous carbon may be doped to be conductive.

An amorphous carbon support layer is deposited on the substrate and a hydrophilic area is prepared.

The attachment area may be delimited by etching of the hydrophobic amorphous carbon layer.

It is thus possible to deposit on the substrate, having if necessary undergone one of the treatments explained above, an amorphous carbon support layer, and a hydrophilic area delimited by an area of amorphous carbon is prepared.

After step c) above, the carbon layer may be removed.

In an alternative, the amorphous carbon may be eliminated partially, to leave remaining an amorphous carbon connection between at least one pad of the component and the surface of the substrate.

After at least partial elimination of the amorphous carbon, it is possible to form, by deposition of a layer of dielectric material or amorphous carbon, a new flat surface at the level of the face of the component or the chip that is not assembled on the substrate, or above this face.

This new flat surface may form the surface of a substrate, then it is possible to form, on this surface, at least one hydrophilic attachment area according to the invention.

It is possible to carry out a new step of assembly of a component according to the invention on this new surface.

A device obtained by a method according to the invention may thus be formed on another device, it also obtained by a method according to the invention. To this end, at the level of the upper surface of one or more components already assembled on the substrate, a surface is formed where assembly is once again possible, for example to assemble a chip on top of the other.

According to another particular embodiment of the invention, a hydrophobic area is formed from a metallic material, for example a material of conductors already present on the surface of the substrate, or one of the portions of a metallic antenna. The metallic material may constitute patterns that form one or more reliefs in relation to the surface of the substrate.

The conductive material may be silver or copper or gold or aluminium or tungsten. More generally, it may be any conductive material available for the formation of electrical contacts for micro-electronics or micro-systems.

The hydrophobic areas thus make it possible, once again, to delimit an area for attaching a chip or a component. The latter could be brought then fixed onto the hydrophilic area by one of the techniques already described above within the scope of the invention.

BRIEF DESCRIPTION OF DRAWINGS

FIGS. 9A and 10A represent substrates in top view, each with an attachment area localised by a metallic contour, FIGS. 9B and 10B represent the substrates of FIGS. 9A and 10A, in top view, with a chip localised in the attachment area delimited by a metallic contour, FIGS. 11A and 11B represent stacks of stages of components according to the invention.

DETAILED DESCRIPTION OF SPECIFIC EMBODIMENTS

Mention will be made below of the implementation of a bonding technique by molecular adhesion. Such a technique is for example described in Q. Y. Tong, U. Gösele, Semiconductor wafer bonding, John Wiley and Sons, pp 57-67, 1999.

Examples of devices formed according to the invention are illustrated in FIGS. 1A-1G.

In each case, the device comprises a support substrate 2 with which, or at the surface of which, a chip 3 is assembled.

In an alternative, it is a support layer on a substrate 1. The latter may then be made of any material, for example plastic, semi-conductor or not.

The substrate 2, or the support layer, is made of a non-functional dielectric or semi-conductor material, for example from the list below. More specifically, the invention implements a hydrophilic portion of the surface of this substrate 2 or the support layer; hereafter, this hydrophilic portion is for example made of a dielectric material or semi-conductor, for example Si, or Ge or GaAs or InP or GaN, or $SiO_2$, or amorphous Si, or silicon nitride, or SiOC, or of conductive oxides ITO. The hydrophilic character may be created and/or reinforced by an appropriate treatment, for example by addition of a layer or by plasma treatment (CARO, $O_2$ plasma, thermal oxidation).

In the case of FIGS. 1A, 1D, 1F and 1G this substrate 2 and its surface are homogeneous.

Figure 1A:
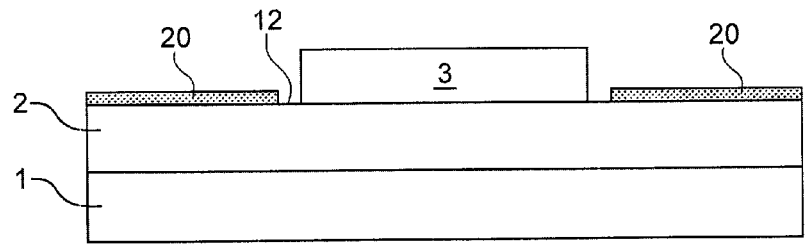
FIGS. 1A to 1G represent components assembled on substrates according to the invention.
Figure 1B:
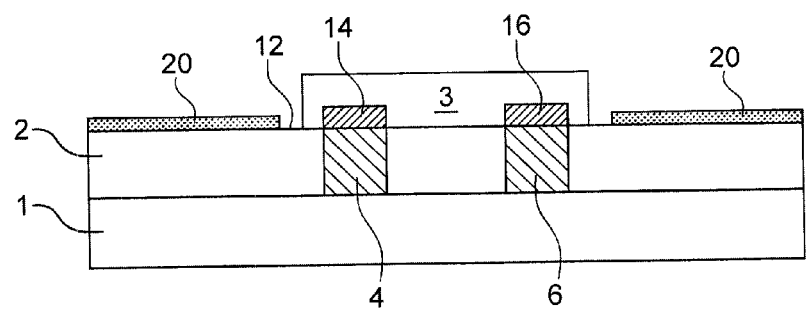
Figure 1C:
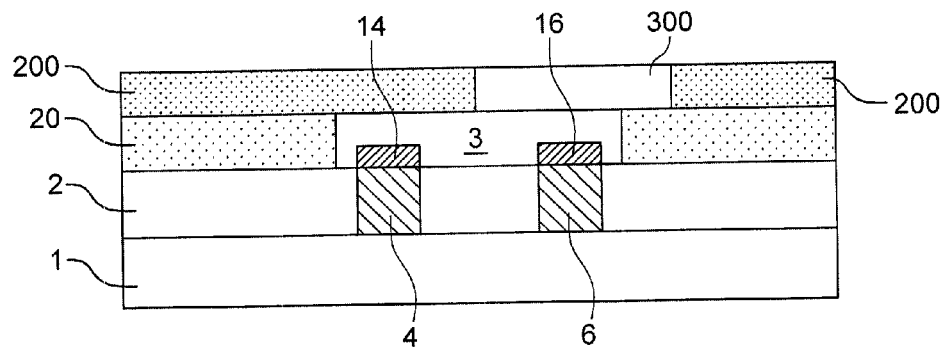
Figure 1D:
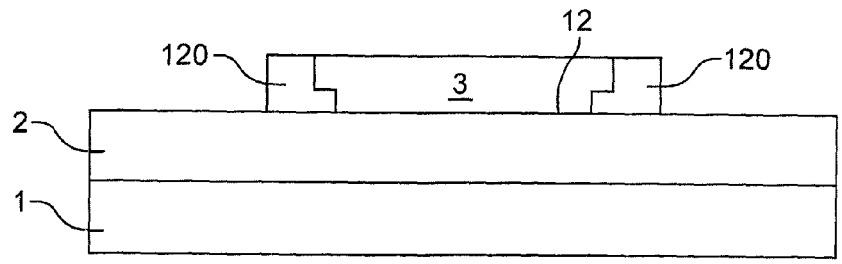
Figure 1E:
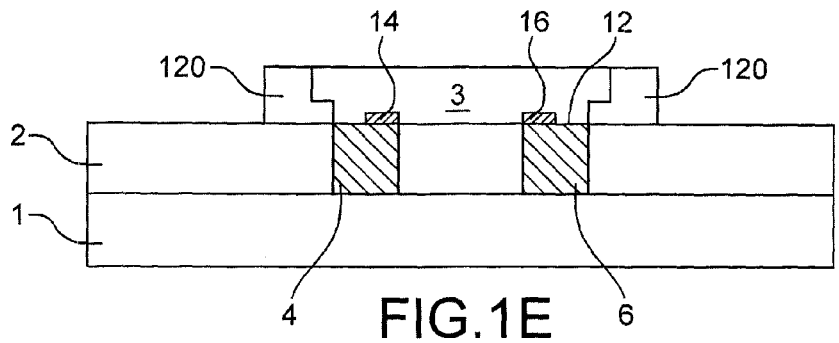
Figure 1F:
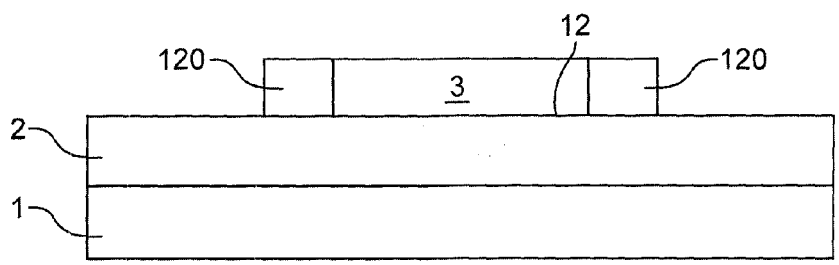

According to the alternatives illustrated in FIGS. 1B and 1E, this substrate 2 or its surface may be heterogeneous. It may then in particular have means such as one or more pads and/or vias and/or contacts ensuring one or more electrical and/or optical and/or thermal functions. It may also comprise components, for example CMOS. The case of vias 4, 6 is illustrated in FIGS. 1B and 1E.

Figure 2A:
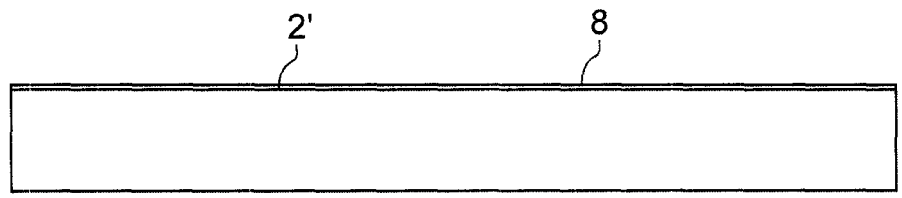
FIGS. 2A-2E represent substrates for the purpose of an implementation of the invention.
Figure 2B:
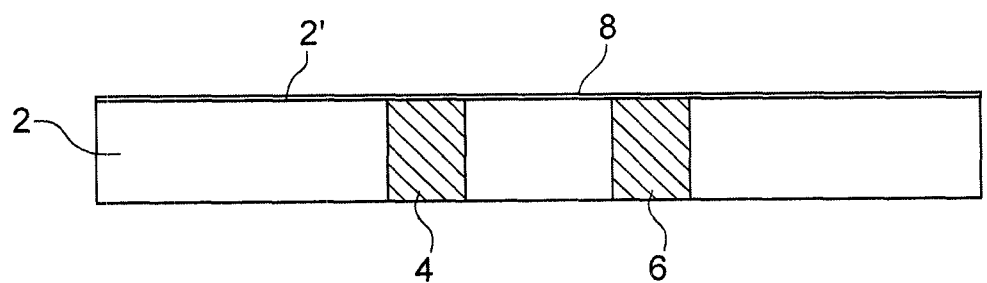
Figure 2C:
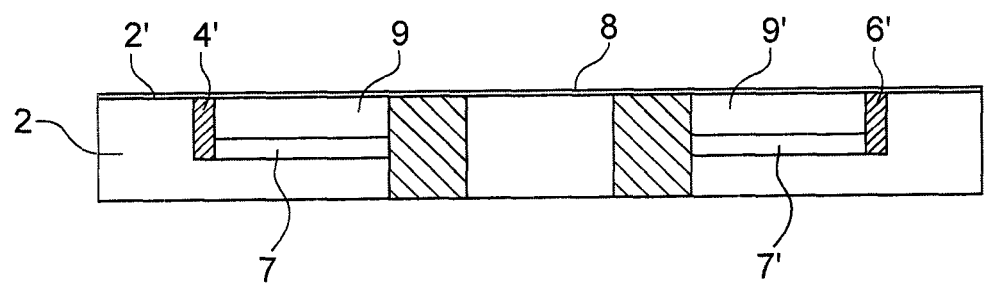

As illustrated in FIG. 2C, one or more layers 7, 9, 7', 9' can also ensure one or more of these functions. In the example of FIG. 2C, the layers 7, 7' ensure an electrical connection between the pads 4, 6 and the pads 4', 6', the layers 9, 9' ensuring the insulation of this connection.

The pads or vias, or contacts or layers may be made of materials different to the material of the rest of the substrate or the layer 2, for example made of copper or $SiO_2$.

In FIGS. 1A-1C, the reference 20 designates an amorphous carbon layer. This layer delimits the area 12 where the transfer of a component or a chip 3 has been carried out.

In the FIGS. 1D to 1G, the reference 120 designates one or more metallic hydrophobic areas, which delimit the area 12 where the transfer of a component or a chip 3 has been carried out. These metallic hydrophobic areas form one or more reliefs in relation to the surface 2' of the substrate 2.

In FIGS. 1D and 1E, the areas 120 comprise a shoulder. But it is also possible, as in FIGS. 1F and 1G, that these areas do not have a shoulder.

Figure 1G:
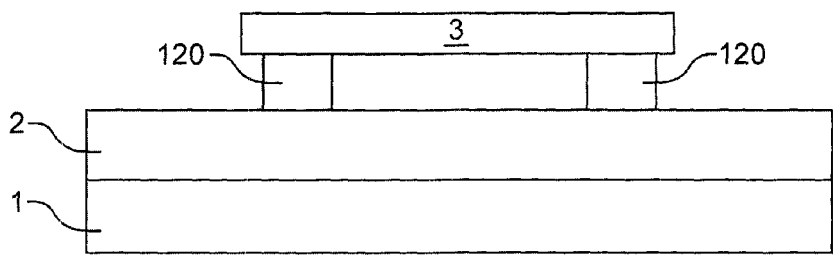

Moreover, FIG. 1G represents the case of a hybridisation at the level of the contact area between the chip 3 and the areas 120. The chip 3 then has metallic pads that make it possible to ensure the connection with these areas 120.

Whatever its nature, homogeneous or heterogeneous, and whatever the nature of the hydrophobic area (made of amorphous carbon or metallic) the surface 2' of the substrate or the layer 2 (see FIGS. 2A-2E) may have undergone one or more treatments in order to functionalise it (in other words prepare it for the purpose of the alignment and the bonding), to carry out the alignment of a component or a chip 3, with a self-assembly area, then the assembly by bonding of the component or the chip 3 on this area. The latter is represented in assembled position in FIGS. 1A-1G. It is also possible that the surface 2' of the substrate comprises an additional layer 8 making it possible to facilitate the bonding of a component or a chip and/or to reinforce the wettability contrast between the area 12 and the layer 20. For example, a bonding layer 8 made of thin oxide (not visible in FIGS. 1A-1G, but visible in FIGS. 2A-2E) is formed by oxygen plasma on the surface 2'.

In the embodiment of FIGS. 1B, 1C and 1E, the chip 3, for example a processed silicon chip, has contact pads 14, 16, in order to form a contact with the pads 4, 6 of the substrate 2 that are flush with the attachment area 12. The chip of FIGS. 1D and 1E has areas of contact with the metallic hydrophobic areas.

In the case of a hydrophobic area made of amorphous carbon, and as illustrated in FIGS. 1A and 1B, there may be, after assembly of the chip 3, a residual thickness 20 of carbon. The assembly of FIGS. 1A and 1B may undergo an additional step of elimination of the layer 20. Such a removal, partial or complete, may be carried out by an oxygen plasma or one containing a sufficient portion of oxygen. A structure such as that of FIGS. 6A-6C results thereof.

FIG. 1C represents another assembly according to the invention, but with two stages, one in which the components are identical or similar to those already described above and are thus designated by identical references, the other which comprises a layer 200 of amorphous carbon stacked on the first, and a component or a chip 300 localised in an opening of this layer 200. To carry out this second stage, once again is used a localisation of the component by wettability contrast, between a hydrophobic area comprising a deposition 200 of amorphous carbon and a hydrophilic area, formed, in FIG. 1C, in part above the component 3 and in part above the amorphous layer 20 of the lower stage. This hydrophilic area may be obtained by formation of a hydrophilic layer on the first stage—as explained later—and delimitation of the attachment area by etching of the amorphous carbon layer 300. This embodiment is also possible with the structures of FIGS. 1D and 1E: on these structures is then deposited an amorphous carbon layer, which is then planarised so as to be able to transfer a new component onto this face.

Any number of stages may be stacked in this manner.

FIGS. 2A-2E represent base substrates 2 from which a support substrate according to the invention is going to be able to be formed.

The substrate of FIG. 2A is homogeneous, made of a semi-conductor material, or other, as already indicated above. The surface 2' is uniform and does not have any topology.

Figure 2D:
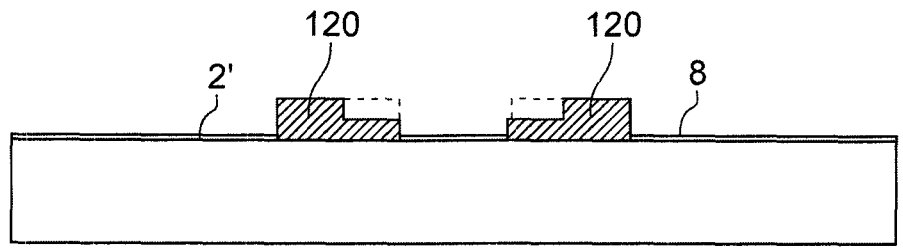

The substrate of FIG. 2D is also homogeneous, made of a semi-conductor material, or other, as already indicated above. But its surface 2' is not uniform and has a topology due to the portions or to the metallic conductors 120.

Figure 2E:
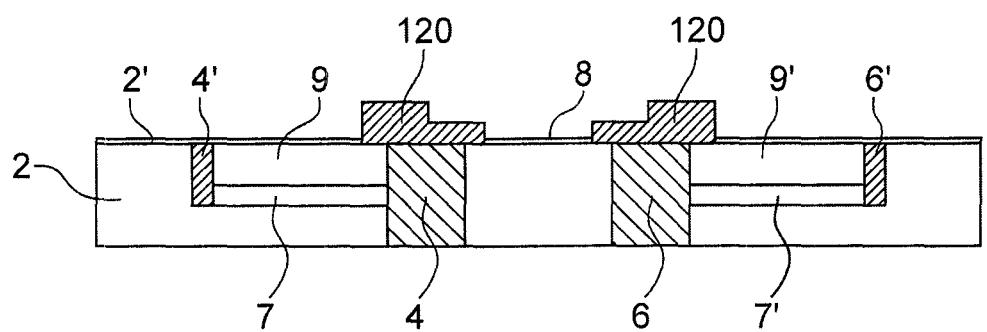

The substrates of FIGS. 2B, 2C and 2E are heterogeneous. Thus the substrate of FIG. 2B comprises pads 4, 6, the function and the nature of which have also already been explained above.

The substrate of each of FIGS. 2C and 2E comprises, apart from the first pads 4, 6, another series of connection pads 4', 6' with one or the other of the particular functions (optical, electrical, etc.) already explained above. These pads make it possible to position one or more chips with interconnections. In addition to the pads, one or more layers or stacks of layers 7, 9, 7', 9' may be formed in the substrate, for example between the pads 4, 4' and 6, 6'.

The surface 2' of each of the substrates of FIGS. 2B, 2C and 2E is heterogeneous. It is firstly heterogeneous in terms of materials: such a substrate is for example made of a dielectric, or semi-conductor material, which surrounds the pads 4, 6 of conductive metal (SiOC and Cu layer). It is also heterogeneous in terms of surface condition, the areas where the pads appear having a different surface condition to that of the dielectric material areas. One or more surface treatments (particularly polishing) make it possible to standardise this surface condition.

In the areas intended to receive a chip or a component, the surface 2' of each of these structures is hydrophilic, for example by the choice of the materials used for the substrate 2 and if appropriate for the pads 4, 6, 4', 6'; or instead it is rendered hydrophilic, by one of the treatments already mentioned above, before assembly of the component or the chip 3.

It is likewise aimed that this surface, at least in these same areas, intended to receive a chip or a component, has the required characteristics for the type of bonding (preferably a direct bonding) that will be used. This surface may be prepared (by polishing and/or cleaning) so as to enable a direct bonding (as described in the work of Tong cited above) or bonding by thermocompression.

In the case of a heterogeneous substrate or a layer 2, its constituent materials are preferably chosen so that these characteristics can be obtained, on the surface 2', by an appropriate treatment, for example by polishing and/or cleaning. A criterion for selecting the materials is the speed of polishing the materials in question.

From one of these structures, a hydrophobic coating is going to make it possible to localise or delimit one or more areas 12 for attachment or assembly of one or more components.

FIG. 2D represents the case of a substrate comprising, on its surface, metallic areas 120 for example portions of conductors or portions of antennas. The substrate itself may be homogeneous (FIG. 2D) or heterogeneous (FIG. 2E). As indicated in FIG. 2D, the areas 120 may also not comprise a shoulder and have the shape that extends up to the broken lines.

The structures of FIGS. 2C and 2E may be used in stacks such as that of FIG. 11B: two stages of components 3, 300 are superimposed on a substrate 2. The connections between the substrate 2 and the furthest component (here: component 300) of this substrate are made via areas that encapsulate the component(s) of the first and the second stage. Contact pick ups 301 make it possible to connect the component(s) of the final stage to the connections of the intermediate stages.

In the case of FIG. 11A, there are also two superimposed stages on a substrate 2, but via the component(s) 3 of the first stage.

In both cases (FIGS. 11A and 11B), a higher number n>2 of stages may be provided: it is thus possible to form connections between the substrate 2 and the component the furthest from this substrate (that of the stage n) either via the n−1 component(s) of the n−1 first stages or via areas that encapsulate the components of the n−1 first stages. A method of forming substrate structures, with layer of amorphous carbon hydrophobic material, will now be described with reference to FIGS. 3A to 3C, from the structures of FIGS. 2A-2C.

Figure 3A:
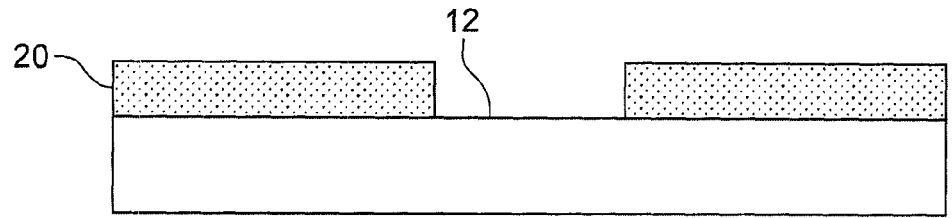
FIGS. 3A-3C represent substrates for the purpose of an implementation of the invention, if necessary with deposition of amorphous carbon to localise one or more assembly sites.
Figure 3B:
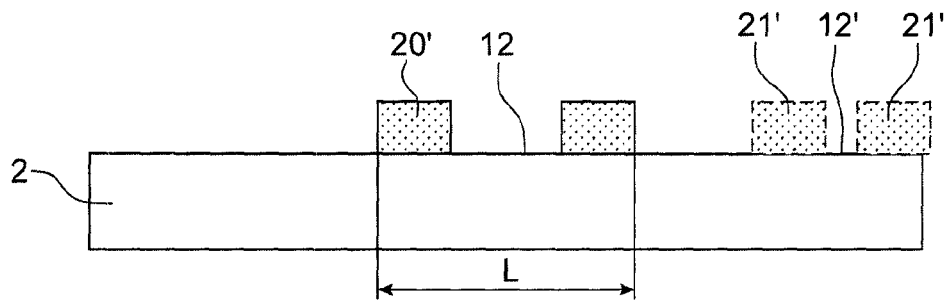
Figure 3C:
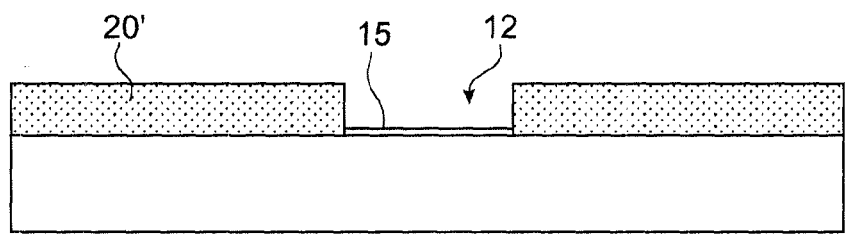

FIG. 3A represents a single attachment area 12, but there may be several 12, 12' of them for a single stage, as illustrated in FIG. 3B. These figures are based on an initial substrate of the type of FIG. 2A, but it is also possible to coat the substrates of FIGS. 2B and 2C with a layer of hydrophobic material, then form in this layer one or more attachment areas. FIG. 1B is moreover a representation of a substrate with component fixed in the hydrophilic area, but with a substrate of the type of FIG. 2B.

During this step, a deposition of a thin film 20 of amorphous carbon is for example carried out.

The attachment area is defined by a pattern, which may be obtained by etching of this thin film. Likewise, strips 20', 21' (FIG. 3B) may be defined by etching of this layer (the deposition of carbon having been carried out on a hydrophilic surface, and etching that enables the elimination of the carbon by an oxidation mechanism (for example a localised plasma or a UV treatment, etc.) is going to make it possible to release the attachment areas without altering the hydrophilic character of the areas thereby laid bare; no additional treatment will thus be necessary to ensure the subsequent self-assembly).

The amorphous carbon coating, which corresponds to each of the attachment areas 12, 12', is limited to a small portion of the surface 2'. The attachment area 12, 12' is the area not covered or not masked by amorphous C, but surrounded by this material or delimited by this material (on which the hybridisation or the attachment of component does not take place).

In the case of FIG. 3B, the assembly constituted by each attachment area 12, 12' and by its strips 20', 21' has on the surface of the substrate 2 a limited lateral extension L. Forming such assemblies of limited width makes it possible to form several assembly areas. This is the case of FIG. 3B, where a second assembly area 12' is formed, by formation of other amorphous carbon strips 21'.

Such a limited lateral extension may also be desirable when the layer or the support substrate 2 only has a satisfactory surface condition on a limited extension or surface, comparable (but superior) to that of the chip to be localised in the area 12.

The hydrophobic layer, here made of amorphous carbon, induces, compared to the rest of the surface of the substrate 2, a contrast in surface tension—thus in wettability—which enables the implementation of a self-assembly of the chips or components to be assembled.

If necessary, a complementary surface treatment of each of the substrates 2 may be implemented, in order to accentuate the localisation of the chips or components by difference in surface energy and/or wettability. To this end, a superficial layer 15 may be formed of oxide of the material of the substrate 2, by means of an oxygen plasma. This treatment brings about a slight superficial etching of the amorphous carbon layer but does not affect its hydrophobic properties. It is moreover an advantageous aspect of the amorphous carbon for the present invention that it does not form an oxide at its surface after exposure to a plasma comprising oxygen.

After this treatment, a surface comprising the amorphous carbon and a hydrophilic material has a high wettability contrast, making it possible to carry out a self-alignment. The difference between the contact angles of a drop of a liquid positioned on the amorphous carbon layer and that of a drop of the same liquid positioned on the hydrophilic material is at least around 40° (for example for a drop of water with 0.3 µl of water, and chips of 5×5 mm2 and of 525 µm thickness). It is for example 80° for a 1 µl drop of water on a PDMS substrate.

It is then aimed to carry out an assembly of a component or a chip, by direct bonding such as molecular bonding.

Figure 4A:
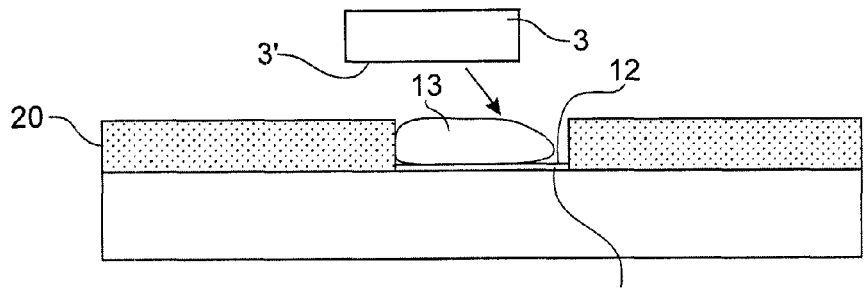
FIGS. 4A-4C represent the localisation of a chip with a substrate according to the invention.
Figure 4B:
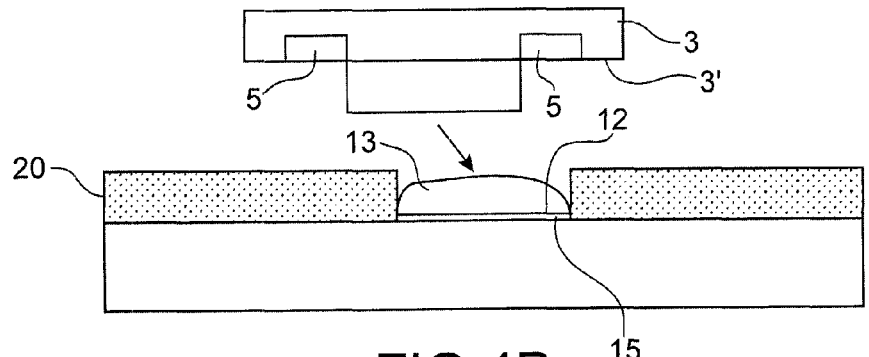
Figure 4C:
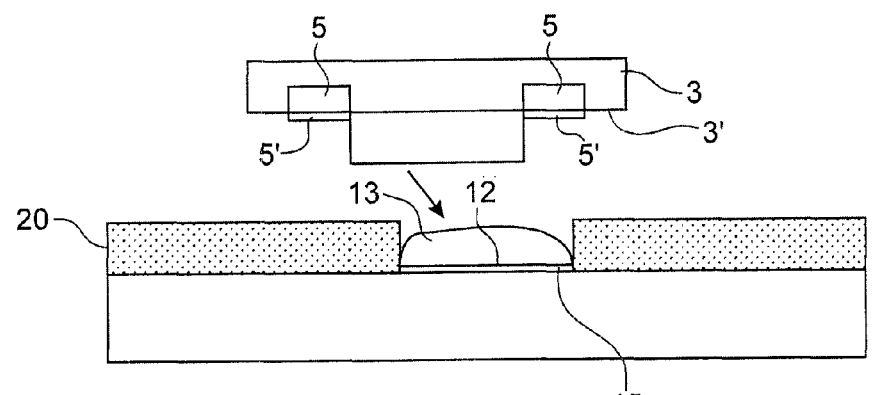

FIGS. 4A-4C represent steps of alignment of a component or a chip on the area, prepared as explained above, of a substrate according to the invention. FIGS. 4A-4C are based on an initial substrate of the type of FIG. 2A, but an alignment may be carried out in the same manner from one of the substrates of FIGS. 2B and 2C, provided with one or more attachment areas, each being delimited by a hydrophobic layer.

This alignment is carried out thanks to the wettability contrast obtained by the treatment, described previously, of the substrate. The component is brought near to the substrate by a technique known as "pick and place", or more generally by any mechanical means.

This component or this chip 3 to be assembled has, moreover, characteristics adapted to the type of assembly or bonding envisaged on the substrate 2, for example a correct evenness over the whole of its surface 3' to be assembled and a particular contamination, as low as possible, of this surface. If this is not the case, a preparation of the surface 3', for example by polishing then cleaning, makes it possible to obtain the desired characteristics. Another possible treatment, for the purpose of a hydrophilic molecular bonding, is a treatment of oxygen plasma type, or under UV/ozone.

But preferably the chip only receives a minimum of treatment, for example only a surface treatment. This is particularly the case when it is wished to assemble numerous standards of chips with different topologies and to adapt the substrate thanks to the shape of the amorphous carbon layer 20.

Figure 8A:
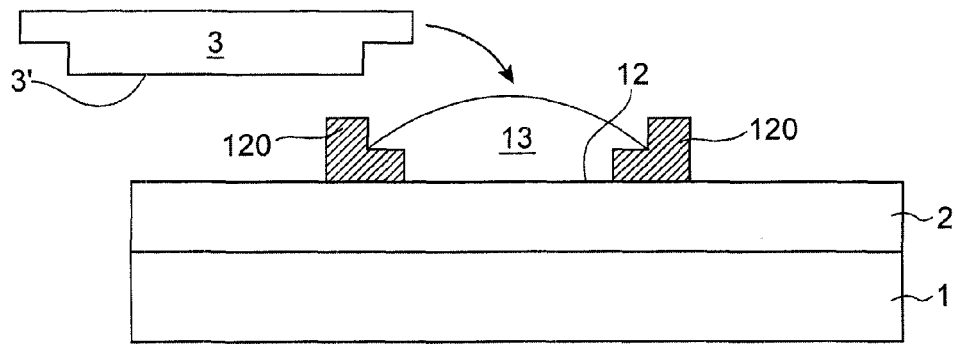
FIGS. 8A and 8B represent the localisation of a chip with a substrate according to the invention, with metallic hydrophobic areas.
Figure 8B:
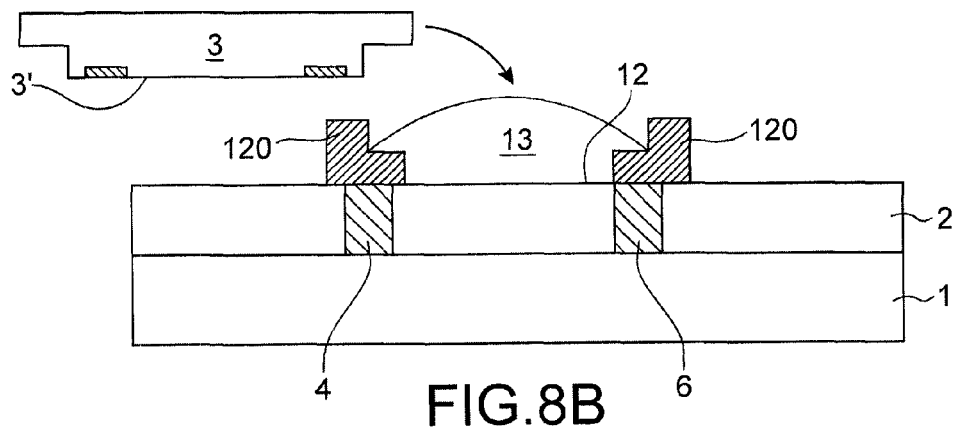

The above comments concerning the preparation of the chip will also apply in the case of the embodiment with metallic hydrophobic area, described hereafter in connection with FIGS. 8A-8B.

In the case of FIG. 4A, one approaches the chip 3 from the assembly site 12. It is thus possible to implement a rough alignment or a positioning of the chip by a method such as a random method, which makes it possible to carry out a rapid but not very precise distribution.

If necessary, a drop 13 of an interface liquid, preferably water, present on the attachment area, makes it possible to align with precision the chip 3 on the pattern 12.

FIGS. 4B and 4C represent the same step, but for a chip 3 comprising interconnection pads 5 for a connection with the substrate via the material of the layer 20.

In the case of FIG. 4C, the chip moreover has, on the surface of the interconnection pads 5, a thin layer 5' made of a low temperature melting metal, which will make it possible to form interconnections for a connection with the substrate, for example by thermocompression. In an alternative, these pads are indium or copper beads. These pads may also only be connection or contact pads and not fixation pads, said fixation being ensured by the part of the chip facing the assembly area 12.

As already indicated with reference to FIG. 4A, the drop 13 of interface liquid may be used to promote the carrying out of this alignment step.

Figure 5A:
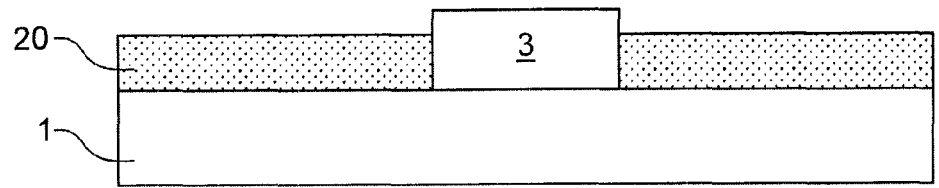
FIGS. 5A-5C represent assemblies of a chip with a substrate according to the invention.
Figure 5B:
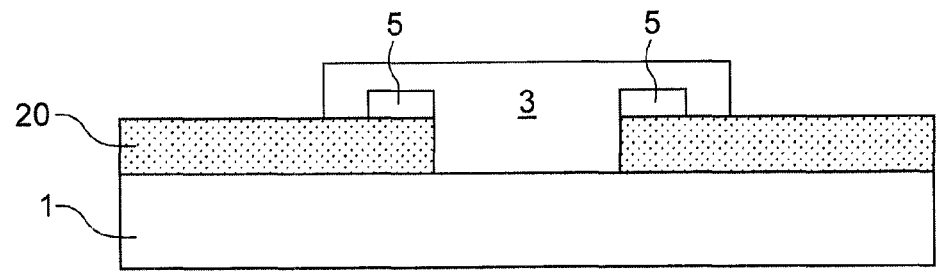
Figure 5C:
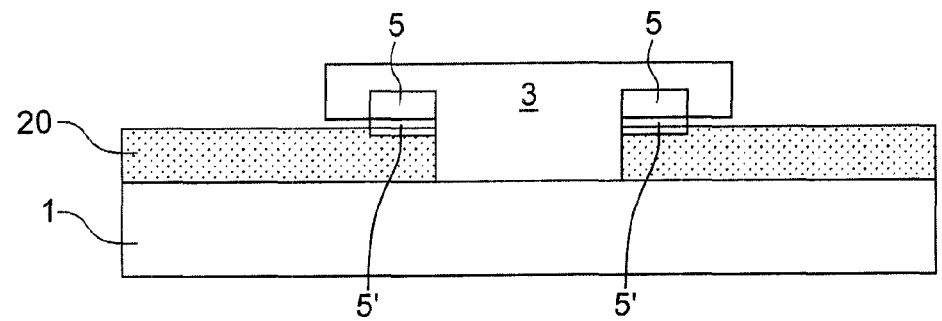

FIGS. 5A-5C represent, for each of the situations illustrated in FIGS. 4A-4C, assemblies, thereby obtained, of a chip with a substrate. The component or the chip 3 is localised in the attachment area 12 created previously. As already indicated above, an assembly by molecular bonding is preferably carried out. The oxide layer 15, if any, promotes such a bonding. The formation of connections 5, 5' of the chip may be obtained by a different method (for example: use of copper beads or connections).

In an alternative, a component or a chip may be bonded by thermocompression (for example by a metallic bonding with copper in particular). This bonding by thermocompression may take place in the hydrophilic area, or not. In the latter case, there is a difference between, on the one hand, the contact areas, for example of electrical type, and, on the other hand, the mechanical fixation areas (by thermocompression).

An at least partial removal of the hydrophobic layer 20, 20', 21' may then be carried out. The structures of FIGS. 6A-6C result, respectively for each of the assemblies of FIGS. 5A-5C. Once again, there may be several chips or components on a single stage.

If necessary, connections between the component or the chip (or the components or the chips) and the substrate may then be established.

Figure 6A:
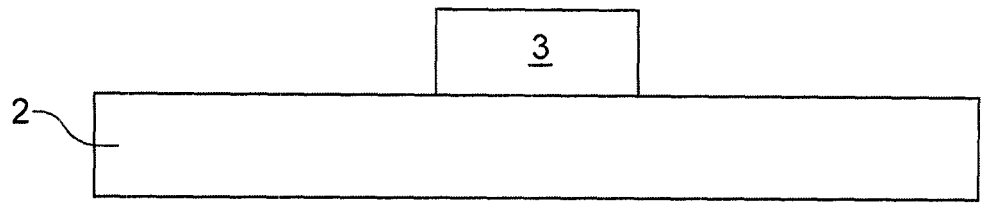
FIGS. 6A-6C represent assemblies of a chip with a substrate according to the invention, after at least partial removal of the amorphous carbon layer.
Figure 6B:
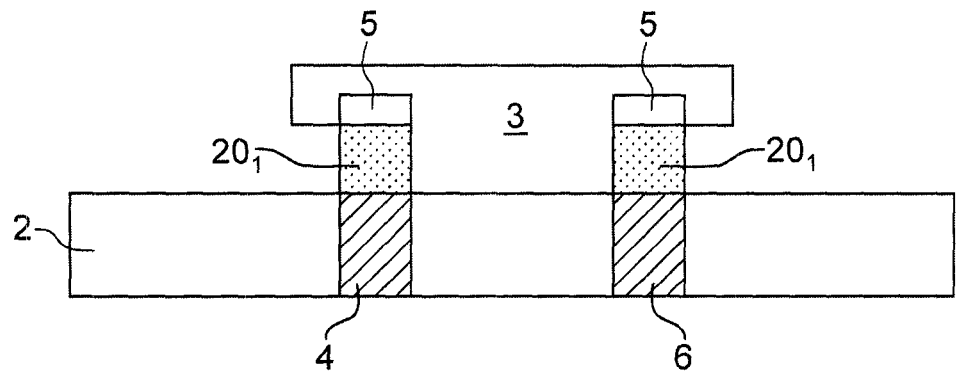
Figure 6C:
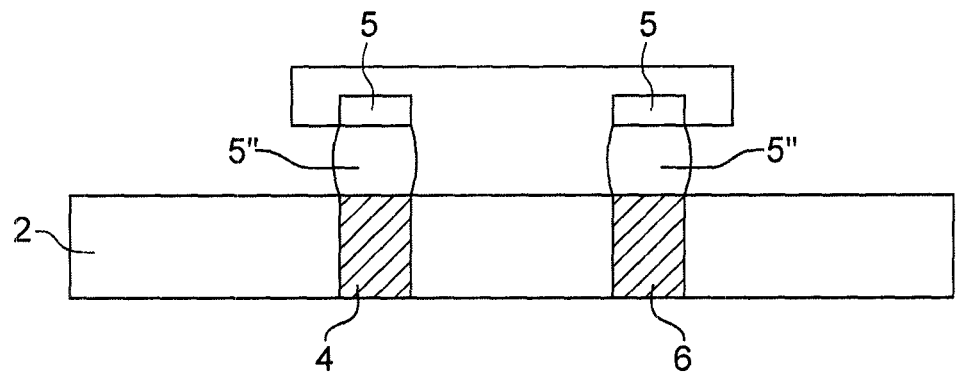

In the case of FIGS. 6A and 6C, it is an integral removal of the layer 20 that has been carried out, by chemical surface treatment, leaving the component 3-substrate 2 assembly unchanged. Such a chemical treatment is for example a treatment by oxygen plasma or plasma containing a sufficient proportion of oxygen.

FIG. 6B represents the case of a partial removal of this layer 20, also by chemical surface treatment, leaving the assembly unchanged. Portions $20_1$ of the layer 20 are maintained, to form a connection or a functional link between the pads 5 and the surface 2' of the substrate 2, and more particularly its pads 4, 6. In order to ensure such a function, the carbon may have been doped, for example to be conductive.

In FIG. 6C, after integral removal of the layer 20, the temperature is raised to a level enabling the low temperature melting of the metal 5', in order to form the connection or the functional link 5" between the pads 5 and the surface 2' of the substrate 2, and more particularly its pads 4, 6.

Whatever the embodiment, it is possible to carry out a second step of integration above the hybridised chip. It is in particular possible to carry out a deposition of a new layer of material, in the areas in which the amorphous carbon has been removed, making it possible to recover a functionalisable flat surface, from which it will be possible to form a new chip-substrate stack, the substrate being this time that obtained after the re-deposition of material.

Figure 7A:
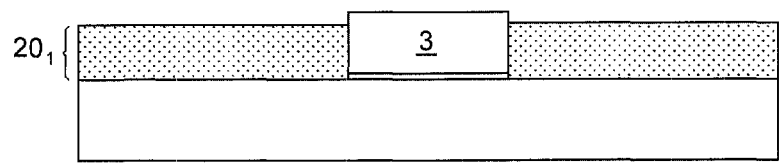
FIGS. 7A-7E represent assemblies of a chip with a substrate according to the invention, after a re-deposition of amorphous carbon or a deposition of dielectric material on the layer of amorphous carbon.

Thus, in FIG. 7A, a re-deposition $20_1$ of amorphous carbon is carried out on the assembly obtained in FIG. 6A. In certain cases, it is also possible not to eliminate this amorphous carbon layer (thus to leave as it is the structure of FIG. 5A), which makes it possible not then to carry out a re-deposition. After a step of polishing of this layer $20_1$, a functionalisable flat surface is recovered, on which a new stage of the stack may be formed.

Figure 7B:
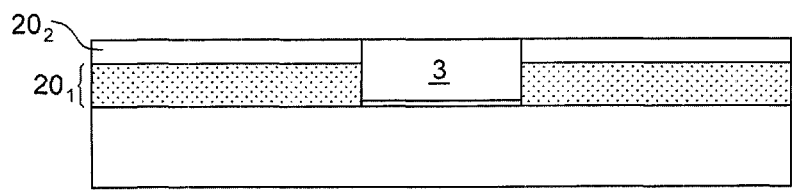
Figure 7C:
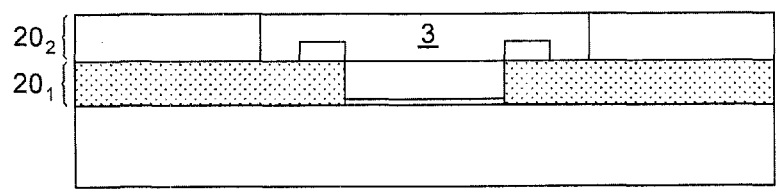

FIGS. 7B and 7C represent cases of deposition of a layer $20_2$ of dielectric material on the amorphous carbon layer $20_1$ to recover a flat non-conducting surface outside of the attachment area. In FIG. 7C, it is the same technique, but it is the chip described in FIG. 4B that is implemented.

Figure 7D:
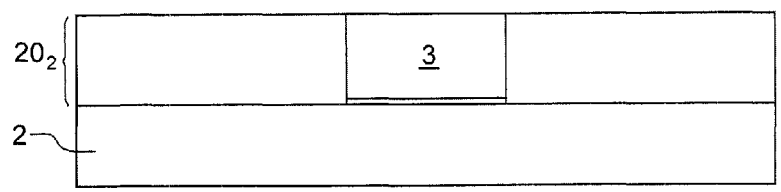
Figure 7E:
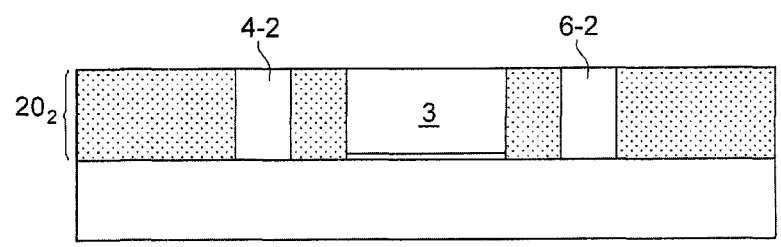

In an alternative, illustrated in FIG. 7D, a deposition $20_2$ of a material other than amorphous carbon may be carried out directly on the substrate 2, after removal of the amorphous carbon layer 20. The material of this layer $20_2$ may be modified so that a functional link can pass through it. Thus, in FIG. 7E, vias 4-2 and 6-2 have been formed in the layer 20-2 to reach the substrate 2 through the latter. The formation of vias is also possible with the structures of FIGS. 7B and 7C.

In other words, after assembly of the chip (structure obtained in FIGS. 6A-6C), it is possible to form a new flat surface at the level of the upper face of the chip 3 integrated on the substrate 2 (or the face non-assembled with the substrate), or above this upper face, for the purpose of a new step of integration, by carrying out a deposition of a material such as a dielectric, or amorphous carbon, followed by CMP type polishing. One thus returns to the initial step, in other words to a new support substrate defined by the component 3 surrounded by a particular material (the dielectric or the amorphous carbon).

On this new support substrate, the steps described above may be carried out: formation of a hydrophilic area delimited by a hydrophobic area, then alignment and assembly of a chip or a component on the hydrophilic area. A structure such as that of FIG. 1C is thereby obtained.

A method of forming substrate structures, with layer of hydrophobic material, here made of a metallic material, will now be described with reference to FIGS. 8A-8B, from the structures of FIGS. 2D and 2E, thus substrate structures if necessary with pads and moreover if necessary with layers 7, 9, 7', 9' that ensure electrical and/or optical and/or thermal functions.

As already explained above:
the surface 2', homogeneous or heterogeneous, of the substrate or the layer 2 may have undergone one or more treatments in order to prepare it for the purpose of the alignment and the bonding, to carry out the alignment of a component or a chip 3, with a self-assembly area, then the assembly by bonding of the component or the chip 3 on this area, the surface 2' of the substrate may comprise an additional layer making it possible to facilitate the bonding of a component or a chip and/or to reinforce the wettability contrast between the area 12 and its perimeter.

The surface 2' of the substrate 2 has, here again, wettability variations on the surface, due to the presence on this surface of two different materials (one of which is metallic), the wettability properties of which are different, which results either from the nature of these materials, or from a specific treatment of all or part of the surface.

The metallic material 120 may be that of a conductor, provided on the surface of the substrate in order to carry out a specific electrical function. For example, it may be the definition of the shape of an antenna on the surface of the substrate 2.

For example the surface may be made of PET, and be provided with a metallic antenna; or instead it may be a surface made of silicon oxide with metallic areas.

In both cases, the metallic part that surrounds the target area, on which it will be aimed to attach a component or a chip, is going to be able to be exploited to carry out the self-assembly: the component 3 will be localised in the hydrophilic attachment area, 12, which is delimited by the metallic and hydrophobic part 120 that surrounds it.

An example of device formed according to the invention has been described above with reference to FIGS. 1D to 1G.

As already indicated above, the component or the chip 3 to be assembled has characteristics adapted to the type of assembly or bonding envisaged on the substrate 2, if necessary this results from a preparation of the surface 3' that makes it possible to obtain the desired characteristics.

To carry out the desired alignment of the chip 3 on the attachment area, a drop of an interface liquid, preferably water, may be arranged by manual or robotic means on the attachment area or in its vicinity.

Due to the contrast in wettability, the drop of fluid deposited on the attachment area or in its vicinity localises itself in this area. The volume of fluid deposited may induce a thickness of water that exceeds that of any topology due for example to metallic patterns that delimit the hydrophilic area 12.

Once exposed to air, the application of an external force such as gravity, or resulting from the passage of an air flow or vibrations enables the drop of fluid 13 to find itself isolated in the attachment area 12.

The drop 13 arranged and correctly localised acts as a restoring force by minimisation of the surface energy of the drop.

A chip 3 may then be brought manually or by a robotic device or by a technique known as "pick and place", or more generally by any mechanical means. Or instead, an alignment or a rough positioning of the chip is implemented by a method such as a random method, which makes it possible to carry out a rapid but not very precise distribution. FIGS. 8A and 8B represent this step, in the case of a substrate and a chip respectively of the type of FIG. 1D or 1E.

The alignment of the chip 3 vis-à-vis the area 12 depends on the quality of the confinement, thus on the wettability difference between the two materials.

After the chip has been arranged on the drop of water, this corrects the misalignment induced by means of a restoring force. This force is the motor for the final alignment of the component 3 and the alignment area 12 and depends on the wettability contrast between the attachment area 12 and its hydrophobic perimeter, whether this contrast is natural or induced by a possible surface treatment.

The interface liquid is then removed.

An assembly by molecular bonding of the chip on its attachment area 12 is preferably carried out. A possible oxide layer 15 in the attachment area 12 promotes such a bonding.

A component or a chip may also be bonded by thermocompression (for example by a metallic bonding with copper).

Structures such as those of FIGS. 1D to 1G are thereby obtained.

Figure 9A:
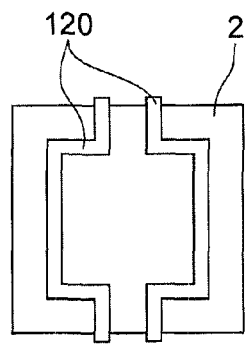

FIGS. 9A and 10A each represent, in top view, an attachment area 12 and its hydrophobic area 120, 120' that delimits it. In FIG. 10A, the areas 120 are connected to other conductors 121.

Figure 9B:
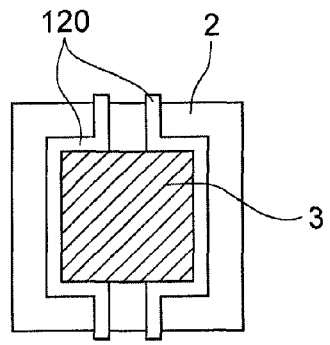

FIGS. 9B and 10B each represent the same area as, respectively, FIGS. 9A and 10A, but with a component 3 positioned and fixed on the hydrophilic area.

A fluid 13 that aids self-assembly within the scope of the present invention is hydrophilic. A very small volume, several micro-drops, is then placed thereon. In document U.S. Pat. No. 6,507,989, on the other hand, the assembly is carried out in the liquid (with the liquid immersing all of the surfaces): a bonding of the type of that implemented within the scope of the present invention (molecular bonding or by thermocompression) is then not possible.

In the article of FUKUSHIMA T et al.: "New three-dimensional integration technology using self-assembly technique", Electron Devices Meeting, Dec. 5 2005, pages 348-351, the assembly does not take place by molecular bonding at the level of the attachment pad. As illustrated in FIG. 4c of this document, the alignment is carried out at the level of first areas ("microbumps") then the assembly is carried out by injection of an adhesive substance (see FIG. 4d for example and the description of FIG. 9 in particular), which spreads everywhere except at the level of these first areas. The assembly is thus not, as in the present invention, carried out by molecular bonding or thermocompression at the level of the alignment areas. Moreover, as already described above, the adhesives used are furthermore sources of pollution and do not allow the carrying out of subsequent technological steps at high temperature.

The invention claimed is:

1. A method comprising:
   providing a substrate with a hydrophilic surface thereon;
   forming, on said hydrophilic surface, an amorphous carbon layer;
   etching said amorphous carbon layer to form at least one hydrophilic attachment area delimited by hydrophobic amorphous carbon zones;
   arranging a drop of an interface hydrophilic liquid on said at least one hydrophilic attachment area,
   aligning at least one of a component or chip on said at least one attachment area by said drop providing a restoring force;
   removing said interface liquid after completion of said aligning; and
   assembling said component or chip with said at least one hydrophilic attachment area, by molecular bonding or thermocompression.

2. The method according to claim 1, further comprising depositing, at least in said at least one hydrophilic attachment area, a layer for bonding, or assisting bonding, of the component or of the chip.

3. The method according to claim 1, further comprising forming an oxide layer in the at least one attachment area.

4. The method according to claim 1, wherein the surface of the substrate is initially homogeneous or initially heterogeneous.

5. The method according to claim 1, wherein the surface of the substrate being is initially heterogeneous, disposing at least one pad, one via or one contact flush with the surface of the substrate and ensuring at least one of an electrical, optical, or thermal connection, at least one of the at least one pad, one via or one contact being localized in the at least one attachment area.

6. The method according to claim 4, wherein the substrate further comprises one or more electrical, optical, or thermal connection layers.

7. A method according to claim 1, wherein the amorphous carbon layer is a thin film.

8. The method according to claim 1, wherein the amorphous carbon layer is eliminated at least partially, after the assembling of the component or the chip.

9. The method according to claim 8, wherein the amorphous carbon layer is eliminated partially, to leave remaining an amorphous carbon connection between at least one pad of the component or the chip and the surface of a substrate.

10. The method according to claim 8, further comprising, after at least partial elimination of the amorphous carbon layer, forming, by deposition of a dielectric material or another amorphous carbon layer, a new flat surface at a level of a face of a component or a chip that is not assembled on the substrate, or above the face.

11. The method according to claim 10, wherein the new flat surface forms the surface of a substrate, the method further comprising formation, on the new flat surface, of at least one hydrophilic attachment area and a hydrophobic area, which delimits the at least one hydrophilic attachment area.

12. The method according to claim 11, wherein the new flat surface forms the surface of a substrate, the method further comprising carrying out a method of assembling a component, on the new surface.

13. The method according to claim 1, wherein the amorphous carbon zones are doped to be conductive.

14. The method according to claim 13, wherein the amorphous carbons zones are one or more antennas.

15. The method according to claim 1, further comprising, before the aligning of said component or said chip, preparing the surface to be assembled of the component or the chip, said preparing including one or more of polishing, treating by oxygen plasma, or applying UV and ozone.

16. The method according to claim 1, wherein the component or the chip includes one or more pads, vias, or contacts.

17. The method according to claim 1, wherein the component or the chip includes one or more layers made of metal, and the method further comprising low temperature melting of the metal.

18. The method according to claim 17, further comprising making a connection between at least one pad of the component and the surface of the substrate.

19. The method according to claim 1, wherein the hydrophobic amorphous carbon zones extend above the hydrophilic attachment area.

20. The method according to claim 1, wherein the hydrophobic amorphous carbon zones confine the drop to the hydrophilic attachment area.

21. The method according to claim 1, wherein the etching is by oxidation.

22. The method according to claim 1, further comprising, after the etching, treating the at least one hydrophilic area with an oxygen plasma to accentuate a difference between the at least one hydrophilic area and the hydrophobic amorphous carbon zones.

23. The method according to claim 1, further comprising, after the etching, applying an oxygen plasma, which increases hydrophilic properties of the at least one hydrophilic area while the hydrophobic amorphous carbon zones remain hydrophobic.

* * * * *